(12) United States Patent
Nagano

(10) Patent No.: US 9,570,640 B2
(45) Date of Patent: Feb. 14, 2017

(54) METHOD OF MANUFACTURING SOLAR CELL MODULE, AND SOLAR CELL MODULE

(71) Applicant: SEIKO EPSON CORPORATION, Tokyo (JP)

(72) Inventor: Daisuke Nagano, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 111 days.

(21) Appl. No.: 14/541,709

(22) Filed: Nov. 14, 2014

(65) Prior Publication Data
US 2015/0136225 A1   May 21, 2015

(30) Foreign Application Priority Data

Nov. 19, 2013  (JP) ................................ 2013-238706
Aug. 26, 2014  (JP) ................................ 2014-171262

(51) Int. Cl.
*H01L 31/0224*   (2006.01)
*H01L 31/18*   (2006.01)
*H01L 31/0445*   (2014.01)

(52) U.S. Cl.
CPC ... *H01L 31/0445* (2014.12); *H01L 31/022425* (2013.01); *Y02E 10/50* (2013.01); *Y02P 70/521* (2015.11)

(58) Field of Classification Search
None
See application file for complete search history.

(56) References Cited

U.S. PATENT DOCUMENTS

| 2012/0211079 A1* | 8/2012 | Hekmatshoar-Tabari | H01L 31/18 136/258 |
| 2015/0007881 A1* | 1/2015 | Khadilkar ....... | H01L 31/022425 136/256 |
| 2016/0181466 A1* | 6/2016 | Adachi ............... | H01L 31/0747 438/64 |

FOREIGN PATENT DOCUMENTS

| JP | A-10-84123 | 3/1998 |
| JP | A-2000-340811 | 12/2000 |
| JP | A-2004-336086 | 11/2004 |
| JP | A-2007-235052 | 9/2007 |
| JP | A-2013-26269 | 2/2013 |

* cited by examiner

*Primary Examiner* — Khaja Ahmad
(74) *Attorney, Agent, or Firm* — Oliff PLC

(57) ABSTRACT

A method of manufacturing a solar cell module includes preparing a solar cell substrate including a support substrate, an electric power generating layer that receives light beams and generates electric power, and a conductive layer that is formed on the electric power generating layer, forming a resist layer on the conductive layer in such a manner that an exposed portion at which the conductive layer is exposed is formed, forming an electric conduction portion at a part of the exposed portion, and etching the conductive layer by using the resist layer and the electric conduction portion as a mask.

1 Claim, 12 Drawing Sheets

METHOD OF MANUFACTURING SOLAR CELL MODULE, AND SOLAR CELL MODULE

CROSS-REFERENCE TO RELATED APPLICATION

This application claims a priority to Japanese Patent Applications {No. 2013-238706 filed on Nov. 19, 2013 and No. 2014-171262 filed on Aug. 26, 2014} which are hereby expressly incorporated by reference in its entirety.

BACKGROUND

1. Technical Field

Several aspects of the present invention relate to a method of manufacturing a solar cell module, and a solar cell module.

2. Related Art

There is suggested a solar cell in which an insulating protective film is provided to protect an electrode formed on a photoelectric conversion layer, for example, an indium tin oxide (ITO) film layer (for example, JP-A-2007-235052).

In the solar cell, it is necessary to form an insulating protective film in such a manner that electrical connection to an electrode is possible, and thus a manufacturing process of the solar cell may be complicated.

SUMMARY

An advantage of some aspects of the invention is to provide a method of manufacturing a solar cell module in which a manufacturing process can be simplified, and a solar cell module.

An aspect of a method of manufacturing a solar cell module according to the invention includes: preparing a solar cell substrate including a support substrate, an electric power generating layer that receives light beams and generates electric power, and a conductive layer that is formed on the electric power generating layer; forming a resist layer on the conductive layer in such a manner that an exposed portion at which a part of the conductive layer is exposed is formed; forming an electric conduction portion at a part of the exposed portion; and etching the conductive layer by using the resist layer and the electric conduction portion as a mask.

According to the method of manufacturing a solar cell module of the aspect, the resist layer that protects the conductive layer, and the electric conduction portion that is an external connection terminal for electric conduction with the conductive layer are provided on the conductive layer. In addition, the conductive layer is etched by using the resist layer and the electric conduction portion as a mask. That is, according to this aspect, the resist layer and the electric conduction portion in a solar cell module, which is finally manufactured, can be used as the mask for etching of the conductive layer. Accordingly, it is possible to simplify a manufacturing process of the solar cell module.

Another aspect of a method of manufacturing a solar cell module according to the invention includes: preparing a solar cell substrate including a support substrate, an electric power generating layer that receives light beams and generates electric power, and a conductive layer that is formed on the electric power generating layer; forming an electric conduction portion in a partial region on the conductive layer; forming a resist layer on the conductive layer at a part of a region in which the electric conduction portion is not formed; and etching the conductive layer by using the resist layer and the electric conduction portion as a mask.

According to the method of manufacturing a solar cell module of the aspect, as in the case with the aspect described above, it is possible to simplify a manufacturing process of a solar cell module.

In the forming of the resist layer, the resist layer may be formed by using a printing method.

According to the method of this configuration, formation of the resist layer becomes easy.

In the forming of the electric conduction portion, the electric conduction portion may be formed by using a printing method.

According to the method of this configuration, formation of the electric conduction portion becomes easy.

A conductive material, which is a material for formation of the electric conduction portion, may contain silver or carbon.

According to the method of this configuration, it is possible to appropriately use the electric conduction portion as a mask during etching of a transparent conductive film layer.

An aspect of a solar cell module according to the invention includes: an electric power generating layer that receives light beams and generates electric power; a conductive layer that is formed on the electric power generating layer; a resist layer that is formed on the conductive layer; and an electric conduction portion that is provided in a resist layer non-forming portion and is electrically connected to the conductive layer. An end edge of a surface of the conductive layer on a resist layer side is flush with an end edge of the resist layer, or is positioned on an inner side in comparison to an end edge of the resist layer in a plan view.

According to the solar cell module of the aspect, it is possible to employ a manufacturing method in which the conductive layer is etched by using the resist layer and the electric conduction portion as a mask.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a solar cell module relating to an embodiment of the invention, and a method of manufacturing the solar cell module will be described with reference to the attached drawings. In this embodiment, description will be given to an example in which the solar cell module is used in a timepiece.

In addition, the range of the invention is not limited to the following embodiment, and modifications can be made in an arbitrary manner in a range of a technical idea of the invention. In addition, in the following drawings, scales, numbers, and the like may be made different between an actual structure and each structure for easy understanding of each configuration.

Solar Cell Module

Figure 1:
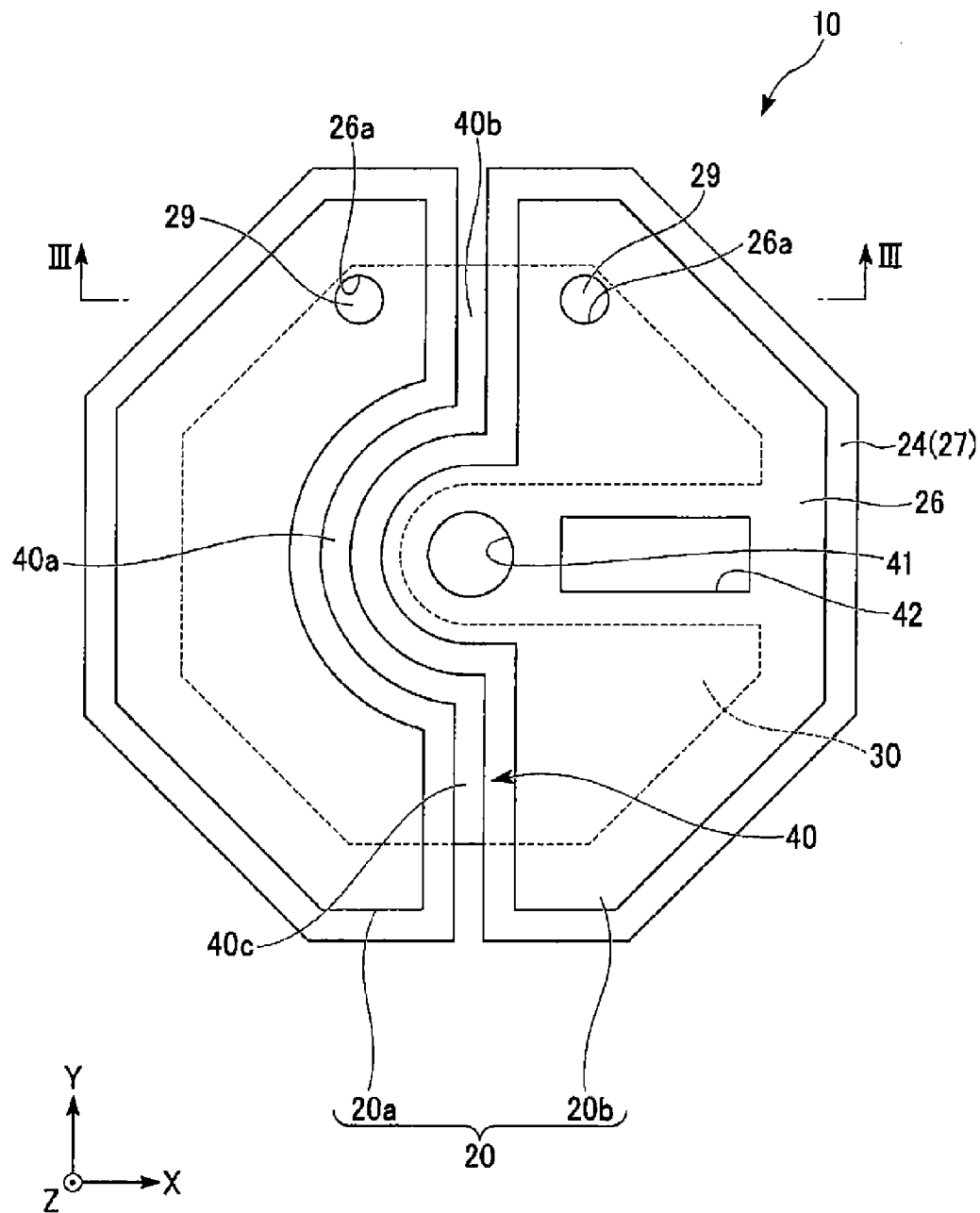
FIG. 1 is a plan view illustrating a solar cell module of this embodiment.
Figure 2:
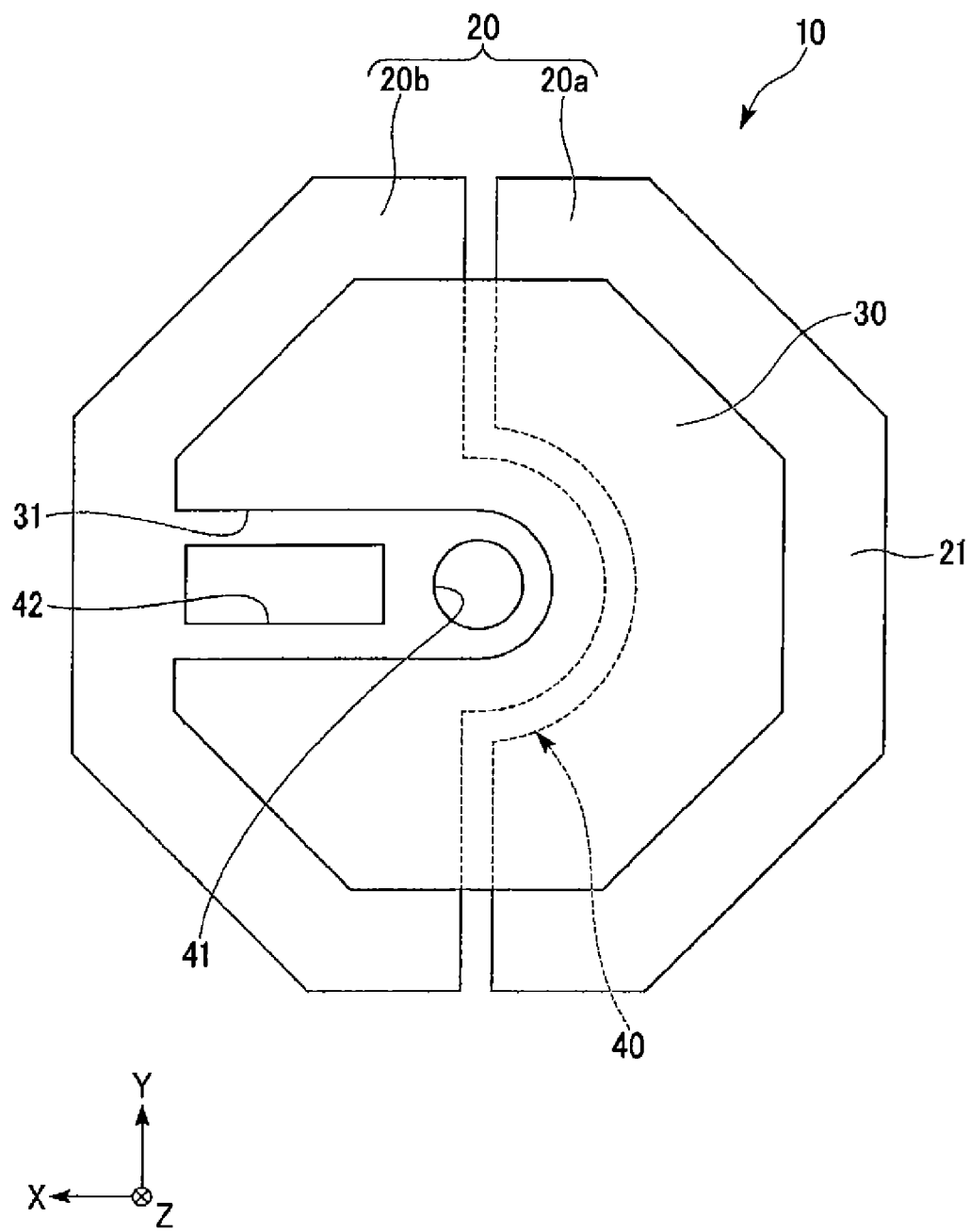
FIG. 2 is a bottom view illustrating the solar cell module of this embodiment.
Figure 3:
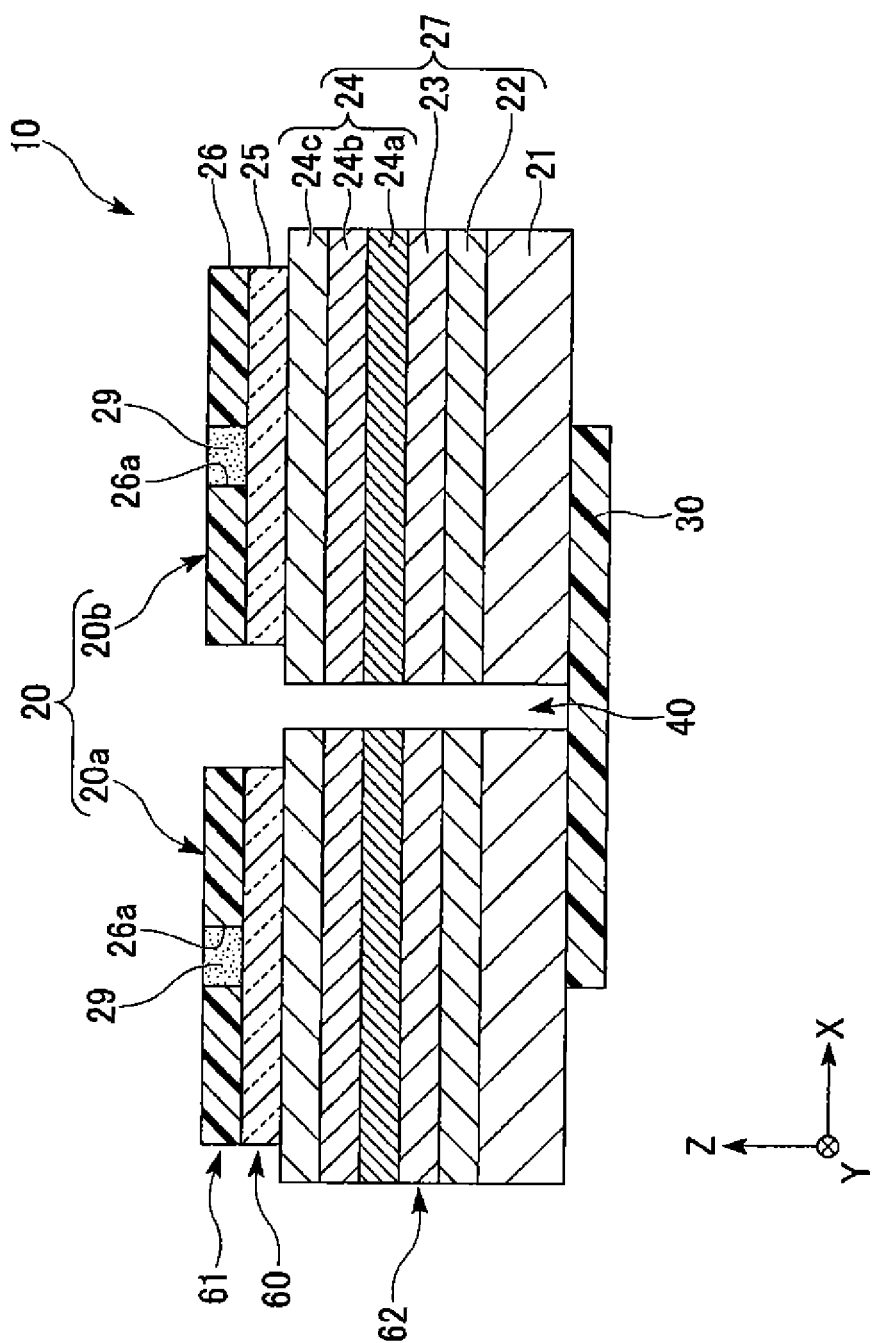
FIG. 3 is a cross-sectional view taken along line III-III in FIG. 1, and illustrates the solar cell module of this embodiment.

FIGS. 1 to 3 are views illustrating a solar cell module 10 of this embodiment. FIG. 1 is a plan view, FIG. 2 is a bottom view, and FIG. 3 is a cross-sectional view taken along line of FIG. 1.

In addition, in the following description, an XYZ coordinate system is set, and positional relationships between respective members will be described with reference to the XYZ coordinate system. At this time, a direction perpendicular to a main surface of a solar cell panel 20 (refer to FIG. 1) is set as a Z-axis direction, a direction, which is perpendicular to the Z-axis direction and becomes a direction of 12 o'clock to six o'clock when the solar cell module 10 is mounted in the timepiece, is set as a Y-axis direction (vertical direction in FIG. 1), and a direction perpendicular to the Z-axis direction and the Y-axis direction, that is, a direction, which becomes a direction of 3 o'clock to 9 o'clock when the solar cell module 10 is mounted in the timepiece, is set as an X-axis direction (horizontal direction in FIG. 1).

As shown in FIGS. 1 and 2, the solar cell module 10 of this embodiment includes the solar cell panel 20 and a flexible substrate 30.

The solar cell panel 20 is a laminated panel that receives solar light beams and generates electric power. In this embodiment, the solar cell panel 20 has an approximately regular octagonal shape in a plan view (when viewed from an XY plane). Bending elasticity of the solar cell panel 20 is larger than bending elasticity of the flexible substrate 30.

As shown in FIG. 3, the solar cell panel 20 has a configuration in which an SUS substrate 21, an aluminum layer (Al layer) 22, a zinc oxide layer (ZnO layer) 23, an electric power generating layer 24, an ITO film layer (conductive layer) 25, and a protective film resist layer (resist layer) 26 are laminated in this order. In addition, the solar cell panel 20 includes an electric conduction portion 29. Light beams are incident to the solar cell panel 20 from a protective film resist layer 26 side (+Z side).

In this embodiment, the SUS substrate 21 is a substrate that functions as a negative electrode.

The aluminum layer 22 is a layer in which irregularity is formed in a surface, and which scatters and reflects light beams transmitted through the electric power generating layer 24 among solar light beams incident to the solar cell panel 20 from a protective film resist layer 26 side (+Z side).

The zinc oxide layer 23 is a layer that adjusts a refractive index of light beams between the electric power generating layer 24 and the aluminum layer 22.

It is possible to increase light use efficiency of the solar cell panel 20 by the aluminum layer 22 and the zinc oxide layer 23.

For example, in this embodiment, the electric power generating layer 24 is a multi-junction type electric power generating layer having a three-layer structure (triple-junction structure). The electric power generating layer 24 includes a first amorphous silicon-germanium layer (a-SiGe layer) 24a, a second amorphous silicon-germanium layer 24b, and an amorphous silicon layer (a-Si layer) 24c in this order from a zinc oxide layer 23 side (−Z side).

The first amorphous silicon-germanium layer 24a and the second amorphous silicon-germanium layer 24b are formed by doping amorphous silicon with germanium. Amounts of doped germanium in the first amorphous silicon-germanium layer 24a and the second amorphous silicon-germanium layer 24b are different from each other. The first amorphous silicon-germanium layer 24a, the second amorphous silicon-germanium layer 24b, and the amorphous silicon layer 24c are set to have absorption wavelength regions different from each other.

The aluminum layer 22, the zinc oxide layer 23, and the electric power generating layer 24 are collectively referred to as a solar cell main body 27.

In this embodiment, the ITO film layer 25 is a transparent conductive film layer that functions as a positive electrode. In this embodiment, as shown in FIG. 3, an end edge 60 of the ITO film layer 25 is formed on an inner side in comparison to an end edge 62 of the solar cell main body 27.

The protective film resist layer 26 is a layer that protects the ITO film layer 25. An end edge 61 of the protective film resist layer 26 is formed on an inner side in comparison to the end edge 62 of the solar cell main body 27. In this embodiment, the end edge 60 of the ITO film layer 25 and the end edge 61 of the protective film resist layer 26 are flush with each other in a plan view (when viewed from an XY plane). In the protective film resist layer 26, a through-hole portion (exposed portion) 26a, which penetrates the protective film resist layer 26 in a thickness direction and which reaches the ITO film layer 25, is formed. A shape of the through-hole portion 26a in a plan view (when viewed from the XY plane) is not particularly limited. In this embodiment, for example, the through-hole portion 26a has a circular shape as shown in FIG. 1.

The protective film resist layer 26 has an insulating property and a light-transmitting property. As a material for formation of the protective film resist layer 26, for example, a transparent resin can be used.

As shown in FIGS. 1 and 3, the electric conduction portion 29 is provided inside the through-hole portion 26a that is formed in the protective film resist layer 26. In other words, the electric conduction portion 29 is provided at a part of a protective film resist layer 26 non-forming portion. The electric conduction portion 29 is formed from a conductive material having conductivity, and is electrically connected to the ITO film layer 25. The electric conduction portion 29 may have a light-transmitting property, or may not have the light-transmitting property. In a case where the electric conduction portion 29 has the light-transmitting property, it is possible to increase an amount of light beams that are emitted to the electric power generating layer 24, and thus it is possible to increase an amount of electric power generation of the solar cell module 10. As a material for formation of the electric conduction portion 29, for example, a material containing silver or carbon, or a conductive polymer can be used.

In addition, in this embodiment, the protective film resist layer 26 non-forming portion represents a portion in which the protective film resist layer 26 is not formed on the ITO film layer 25.

As shown in FIG. 1, a division line 40 constituted by a linear gap, a through-hole 41 for provision of hands of the timepiece, and a through-hole 42 for a date window are formed in the solar cell panel 20.

The solar cell panel 20 is divided into a plurality of individual pieces by the division line 40. In this embodiment, the solar cell panel 20 is divided into two individual pieces including a first individual piece 20a and a second individual piece 20b. The second individual piece 20b includes the center of the solar cell panel 20.

The through-hole 41 is formed at the center of the solar cell panel 20. Accordingly, the through-hole 41 is formed in the second individual piece 20b.

The division line 40 includes an arc portion 40a, a first straight line portion 40b, and a second straight line portion 40c.

The arc portion 40a centers around the through-hole and has a semi-arc shape having a diameter that is approximately ⅓ times that of the solar cell panel 20 in a plan view (when viewed from the XY plane). The arc portion 40a is formed to be convex toward the nine o'clock side (−X side) of the timepiece.

The first straight line portion 40b and the second straight line portion 40c have a straight line shape that extends along a direction of 12 o'clock to 6 o'clock (Y-axis direction) of the timepiece.

As shown in FIG. 2, the flexible substrate 30 is bonded onto the SUS substrate 21 of the solar cell panel 20 to connect the first individual piece 20a and the second individual piece 20b. The flexible substrate 30 has a shape in which a part of a regular octagon is missed by a notched portion 31 in a plan view (when viewed from the XY plane).

The notched portion 31 is a strip-shaped notch in which an end on a center side (−X side) of the solar cell panel 20 has an arc shape in a plan view (when viewed from the XY plane). The notched portion 31 is formed up to the center of the flexible substrate 30. The flexible substrate 30 is bonded onto the SUS substrate 21 so as not to overlap the through-hole 41 and the through-hole 42. In other words, the flexible substrate 30 is bonded onto the SUS substrate 21 in such a manner that the through-hole 41 and the through-hole 42 are disposed inside the notched portion 31. In addition, the flexible substrate 30 is bonded onto the SUS substrate 21 so as not to overlap an electrode connection portion (not shown) on an SUS substrate 21 side in a plan view (when viewed from the XY plane). The electrode connection portion on the SUS substrate 21 side may be disposed inside the notched portion 31, or may be disposed outside the notched portion 31.

An area of the flexible substrate 30 in a plan view (when viewed from the XY plane) is smaller than an area of the solar cell panel 20 in a plan view (when viewed from the XY plane). In addition, bending elasticity of the flexible substrate 30 is smaller than bending elasticity of the solar cell panel 20.

Method of Manufacturing Solar Cell Module

Figure 4:
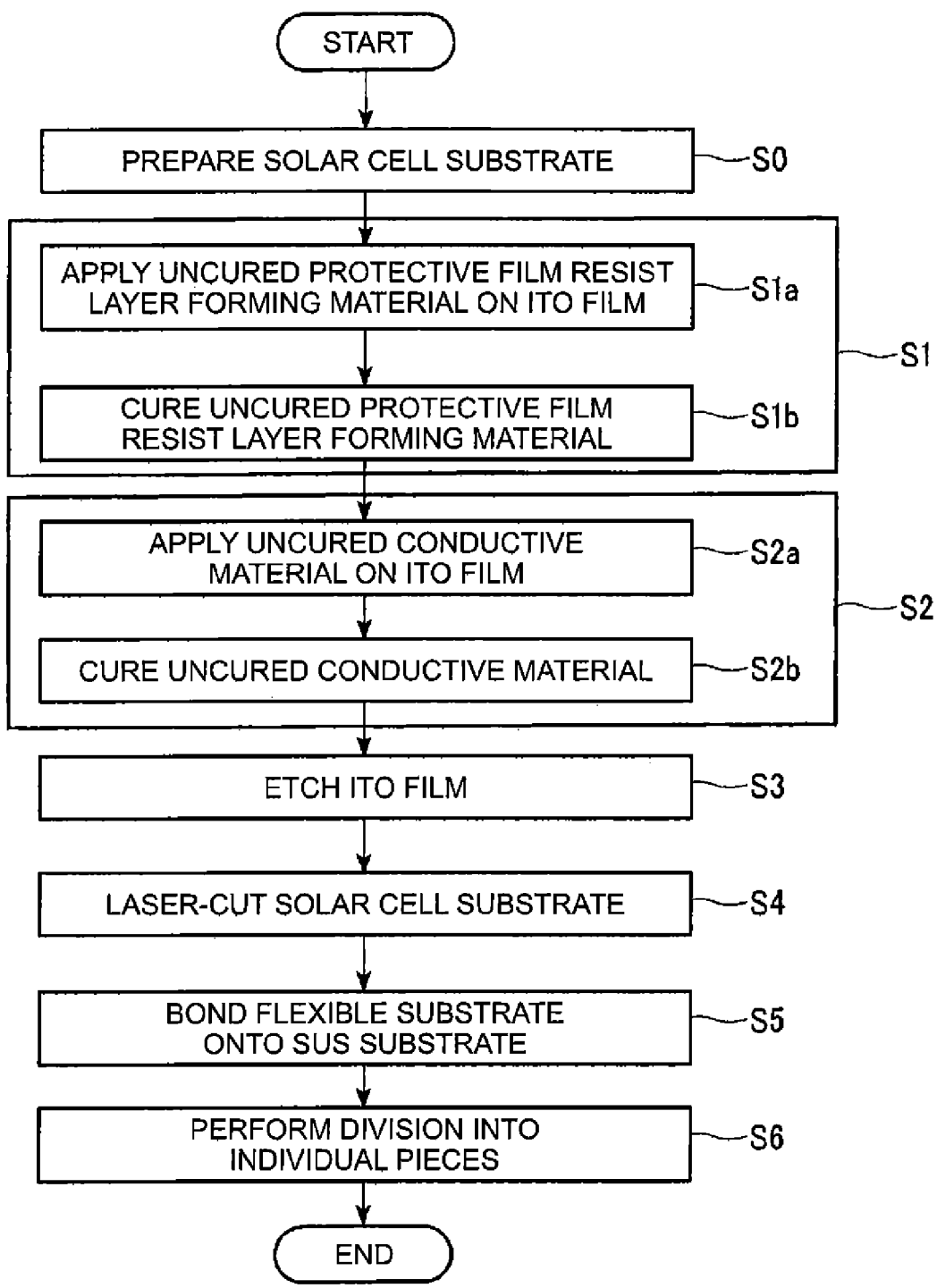
FIG. 4 is a flowchart illustrating a method of manufacturing the solar cell module of this embodiment.
Figure 6:
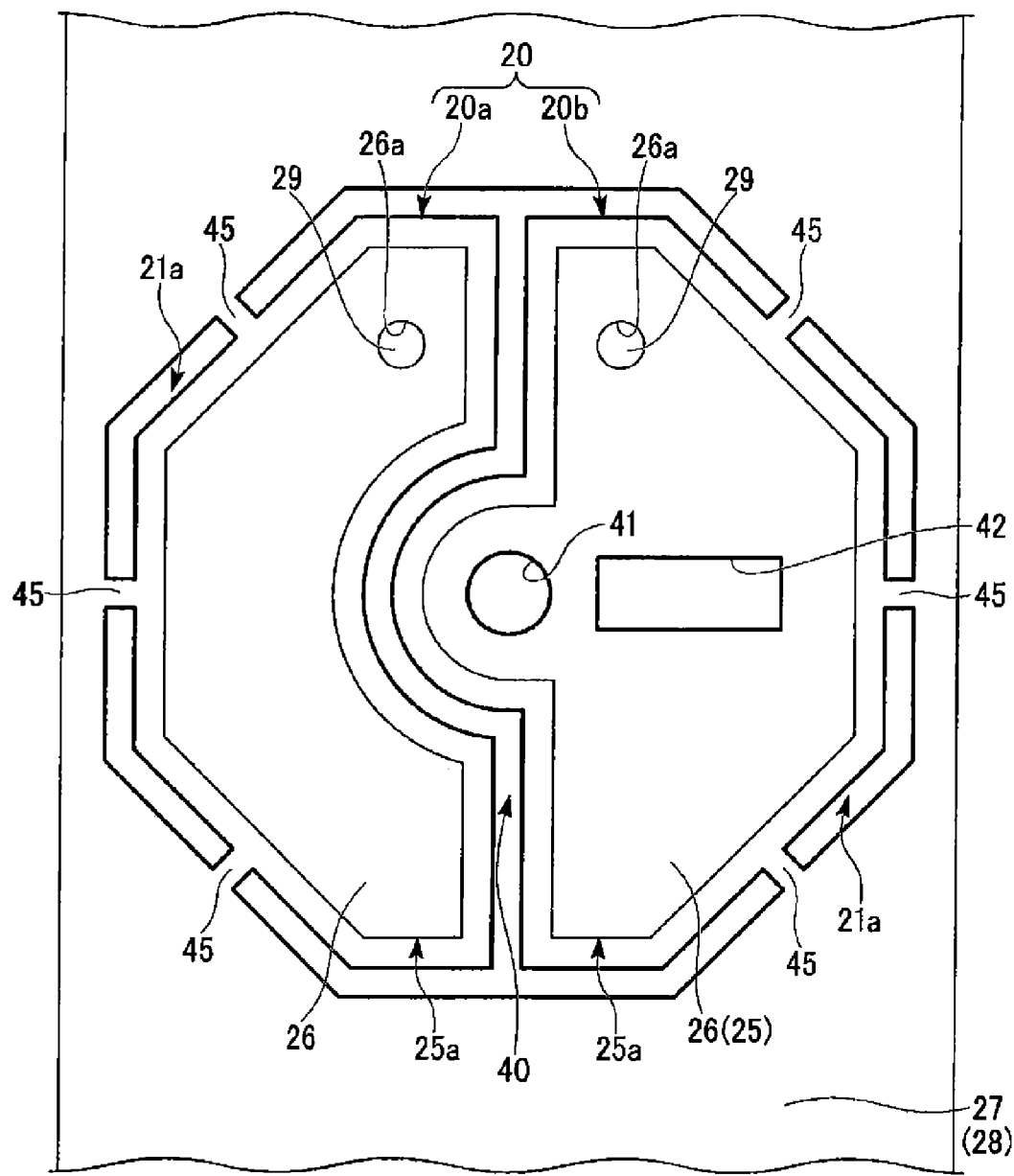
FIG. 6 is a plan view illustrating a solar cell panel during manufacturing of the solar cell module of this embodiment.
Figure 7A:
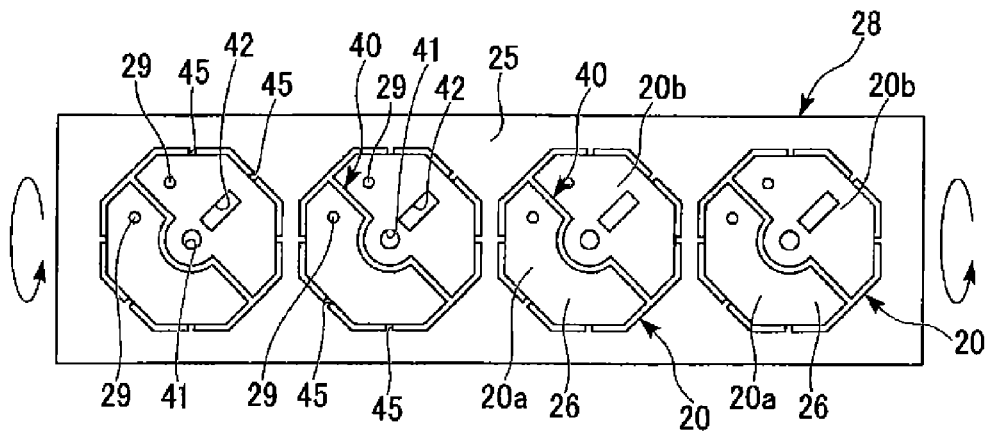
FIGS. 7A to 7C are plan views illustrating the sequence of the method of manufacturing the solar cell module of this embodiment.
Figure 7B:
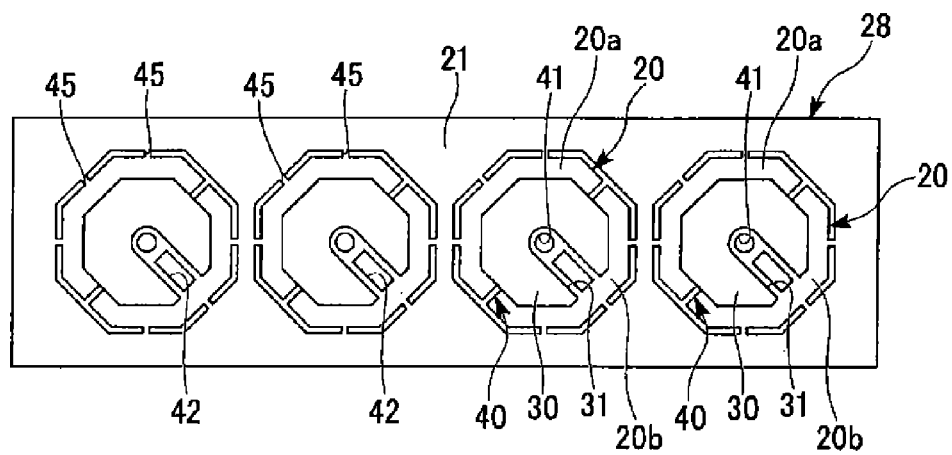
Figure 7C:
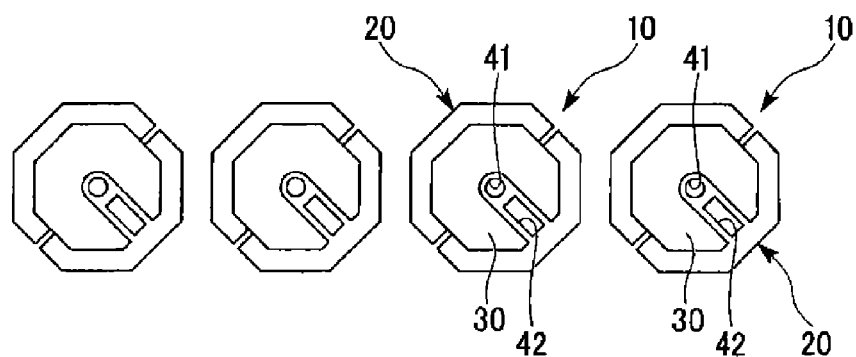

FIG. 4 is a flowchart illustrating a method of manufacturing the solar cell module of this embodiment. FIGS. 5A to 5D are cross-sectional views illustrating a sequence of the method of manufacturing the solar cell module of this embodiment. FIG. 6 is a plan view illustrating the solar cell panel 20 during manufacturing of the solar cell module of this embodiment, and is an enlarged view of the solar cell panel 20 in FIG. 5D. FIGS. 7A to 7C are plan views illustrating a sequence of the method of manufacturing the solar cell module of this embodiment.

As shown in FIG. 4, the method of manufacturing the solar cell module of this embodiment includes a substrate preparing process S0, a protective film resist layer forming process (resist layer forming process) S1, an electric conduction portion forming process S2, an etching process S3, a laser-cutting process S4, a flexible substrate bonding process S5, and an individually dividing process S6.

First, the substrate preparing process S0 is a process of preparing a solar cell substrate 28 in which the SUS substrate 21, the solar cell main body 27, and the ITO film layer 25 are laminated in this order. In this embodiment, the solar cell substrate 28 having a large size, with which a plurality of solar cell modules can be manufactured, is prepared.

Next, the protective film resist layer forming process S1 is a process of forming the protective film resist layer 26 on a surface of the ITO film layer 25. The protective film resist layer forming process S1 includes an application process S1a and a curing process S1b.

The application process S1a is a process of applying an uncured protective film resist layer forming material.

Figure 5A:
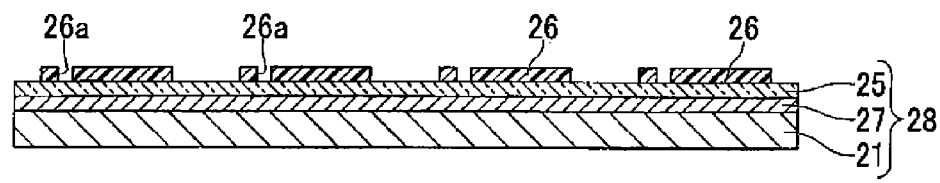
FIGS. 5A to 5D are cross-sectional views illustrating a sequence of the method of manufacturing the solar cell module of this embodiment.

As shown in FIG. 5A, the uncured protective film resist layer forming material is applied to a surface of the ITO film layer 25 of the solar cell substrate 28. The protective film resist layer forming material is patterned to form a shape of the protective film resist layer 26, and is selectively applied to a partial region on the ITO film layer 25. As a method of applying the protective film resist layer forming material, for example, a screen printing method is used in this embodiment. According to this process, the uncured protective film resist layer forming material is applied onto the ITO film layer 25.

The curing process S1b is a process of firing the applied protective film resist layer forming material to cure the protective film resist layer forming material. According to this process, the uncured protective film resist layer forming material is cured.

Through the above-described processes, the protective film resist layer forming process S1 is terminated, and the protective film resist layer 26 is formed. In the protective film resist layer 26, the through-hole portion 26a at which the ITO film layer 25 is exposed is formed. In this embodiment, the protective film resist layer 26 non-forming portion, that is, an exposed portion at which the ITO film layer 25 is exposed includes sites at which the through-hole 41 and the through-hole 42 are formed, and outer regions of the protective film resist layer 26 in addition to the through-hole portion 26a.

In addition, in this embodiment, the "exposed portion" represents a portion in which the ITO film layer 25 is exposed immediately after the protective film resist layer forming process S1 is terminated.

Next, the electric conduction portion forming process S2 is a process of forming the electric conduction portion 29 at a part of the exposed portion. The electric conduction portion forming process S2 includes an application process S2a and a curing process S2b.

Figure 5B:
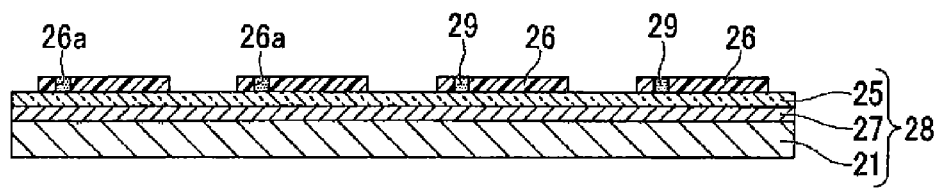

As shown in FIG. 5B, the application process S2a is a process of selectively applying an uncured conductive material to the through-hole portion 26a in the exposed portion in which the ITO film layer 25 is exposed. In other words, in the application process S2a, the uncured conductive material is applied to a part of the exposed portion in which the ITO film layer 25 is exposed.

The uncured conductive material is applied to the inside of the through-hole portion 26a so that the ITO film layer 25 is not exposed. The uncured conductive material may leak slightly from the through-hole portion 26a.

As a method of applying the uncured conductive material, for example, the screen printing method is used in this embodiment. According to this process, the inside of the through-hole portion 26a is filled with the uncured conductive material.

The curing process S2b is a process of firing the uncured conductive material that is applied to cure the uncured conductive material. According to this process, the uncured conductive material is cured.

Through the above-described process, the electric conduction portion forming process S2 is terminated, and the electric conduction portion 29 that is electrically connected to the ITO film layer 25 is formed.

Figure 5C:
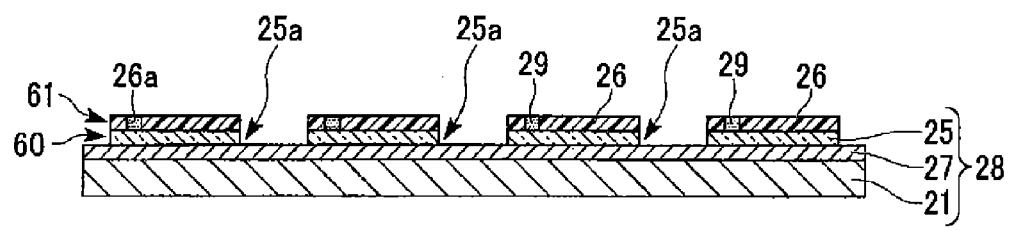

Next, as shown in FIG. 5C, the etching process S3 is a process of patterning the ITO film layer 25 by etching.

In the ITO film layer 25, sites to be removed by the etching include sites in which the through-hole 41 and the through-hole 42 are formed, and outer portions of the protective film resist layer 26. That is, the sites to be removed by the etching are portions excluding the through-hole portion 26a from the above-described exposed portion. A site at which the ITO film layer 25 is removed includes a region to be layer-cut in the subsequent process. The ITO film layer 25 is removed over the whole region in the thickness direction. That is, the ITO film layer 25 is removed to expose the solar cell main body 27.

An etching method may be dry etching or wet etching without particular limitation. According to this process, a shape pattern 25a constituted by a portion in which the ITO film layer 25 is removed is formed (refer to FIG. 6). For example, in this embodiment, the end edge 60 of the ITO film layer 25 and the end edge 61 of the protective film resist layer 26 are formed to be flush with each other in a plan view.

In addition, in this embodiment, the end edge 60 of the ITO film layer 25 represents a boundary between a portion removed by the etching and a remaining portion. In addition, the end edge 61 of the protective film resist layer 26 represents a side edge portion of the protective film resist layer 26 which is formed by an external shape of the protective film resist layer 26 in a plan view and external shapes of the through-hole 41 and the through-hole 42 in a plan view.

In addition, in a case of selecting the wet etching as the etching method, for example, an etchant which does not etch the SUS substrate 21 is selected, or a protective film is formed on the SUS substrate 21 in order for the SUS substrate 21 not to be etched.

Figure 5D:
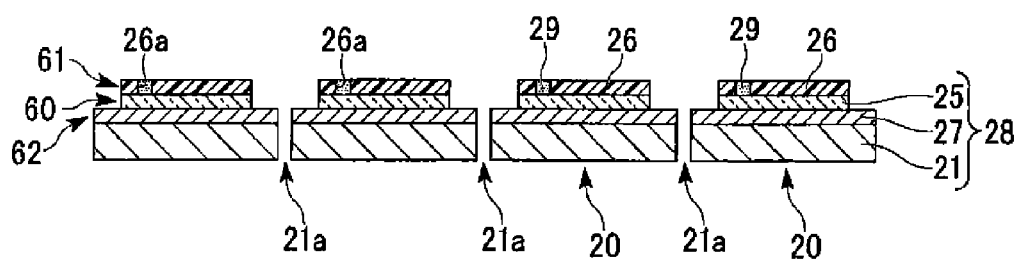

Next, as shown in FIG. 5D, the laser-cutting process S4 is a process of laser-cutting the solar cell substrate 28, more specifically, the SUS substrate 21 and the solar cell main body 27. As shown in FIG. 6, the laser-cutting is performed along external shapes of the first individual piece 20a and the second individual piece 20b so as to leave a connection portion 45 that is connected to the solar cell substrate 28 to be described later. A laser-cut width is narrower than a width of a portion in which the ITO film layer 25 is removed by the etching process S3.

According to this process, a shape pattern 21a constituted by a portion in which the SUS substrate 21 and the solar cell main body 27 are removed is formed, and the solar cell panel 20 is formed. The solar cell panel 20 is not detached from the solar cell substrate 28 due to the connection portion 45.

As described above, the through-hole portion 26a is formed in a surface of the protective film resist layer 26 as shown in FIG. 6, and the electric conduction portion 29 is provided inside the through-hole portion 26a. The electric conduction portion 29 is electrically connected to the ITO film layer 25, and becomes a connection terminal during interconnection of the solar cell panel 20. In addition, as shown in FIG. 5D, the protective film resist layer 26 and the ITO film layer 25 are formed on an inner side in comparison to the end edge 62 of the solar cell main body 27.

As shown in FIGS. 6 and 7A, each solar cell panel 20 is connected to the solar cell substrate 28 through the connection portion 45. The connection portion 45 is a remaining portion that is not cut out in the above-described laser-cutting process S4. Six connection portions 45 are provided for each solar cell panel 20. More specifically, each of the first individual piece 20a and the second individual piece 20b of the solar cell panel 20 is connected to the solar cell substrate 28 by three connection portions 45.

Next, as shown in FIG. 7B, the flexible substrate bonding process S5 is a process of turning the solar cell substrate 28 over and bonding the flexible substrate 30 onto the SUS substrate 21. The flexible substrate 30 is bonded so as to connect the first individual piece 20a and the second individual piece 20b of the solar cell panel 20. A method of bonding the flexible substrate 30 is not particularly limited, and for example, a bonding method using a roller can be selected. According to this process, the first individual piece 20a and the second individual piece 20b are connected to each other by the flexible substrate 30.

Next, as shown in FIG. 7C, the individually dividing process S6 is a process of cutting the connection portion 45 to separate respective solar cell panels 20 from the solar cell substrate 28. According to this process, the solar cell panels 20 are individually divided.

Through the protective film resist layer forming process S1 to the individually dividing process S6, the method of manufacturing the solar cell module is completed, and a plurality of the solar cell modules 10 are manufactured from the large-sized solar cell substrate 28.

According to this embodiment, the protective film resist layer 26 that protects the ITO film layer 25 and the electric conduction portion 29 that is electrically connected to the ITO film layer 25 are provided on the surface of the ITO film layer 25. In addition, the ITO film layer 25 is etched by using the protective film resist layer 26 and the electric conduction portion 29 as a mask. That is, according to this embodiment, since the ITO film layer 25 is etched by using the protective film resist layer 26 and the electric conduction portion 29 as a mask in each of the solar cell modules 10 that are finally manufactured, it is not necessary to remove the mask that is used at least for etching of the ITO film layer 25. Accordingly, the manufacturing process of the solar cell module can be simplified.

In addition, in a case of forming the electric conduction portion electrically connected to the ITO film layer by applying a resist or a protective film onto the ITO film layer, and by removing a part or the entirety of the resist or the protective film, removal of the resist or the protective film may be insufficient, and thus connection failure may occur in an electrical connection between the electric conduction portion and the ITO film layer in some cases.

In contrast, according to this embodiment, the electric conduction portion 29 is formed on the ITO film layer 25 in a region in which other materials are not applied. Therefore, according to this embodiment, electrical connection failure between the electric conduction portion 29 and the ITO film layer 25 due to deficiency in removal of the applied materials can be suppressed, and thus the solar cell module having excellent electrical connection reliability is obtained.

In addition, according to this embodiment, as methods of applying materials for formation of the protective film resist layer 26 and the electric conduction portion 29, the screen printing method is used in each case. In other words, the protective film resist layer 26 and the electric conduction portion 29 are formed by using the screen printing method. Therefore, according to this embodiment, it is easy to form the protective film resist layer 26 that is patterned to form an exposed portion, and the electric conduction portion 29.

In addition, according to this embodiment, the end edge of the ITO film layer 25 is flush with the end edge of the protective film resist layer 26 in a plan view. Accordingly, it is possible to suppress an amount of material necessary for formation of the protective film resist layer 26 to a minimum, and thus it is possible to reduce the manufacturing cost of the solar cell module.

In addition, according to this embodiment, a deviation between the ITO film layer 25 and the protective film resist layer 26 does not occur in consideration of the manufacturing method, and thus it is possible to reliably cover the ITO film layer 25 with the protective film resist layer 26.

As is the case with the solar cell module 10 in this embodiment, a configuration in which the end edge of the ITO film layer is flush with the end edge of the protective film resist layer is specific to the method of manufacturing the solar cell module of this embodiment.

In a case of forming the protective film on the ITO film layer after etching the ITO film layer, a material for formation of the protective film is applied from an upper side of the ITO film layer that is patterned, and thus the protective film is formed in such a manner that the end edge thereof is located on an outer side of the end edge of the ITO film layer.

In contrast, in this embodiment, the protective film resist layer 26 is used as a mask for etching of the ITO film layer 25, in other words, the protective film resist layer 26 is formed on the ITO film layer 25 before etching of the ITO film layer 25, and thus it is possible to manufacture the solar cell module in which the end edge 60 of the ITO film layer 25 is flush with the end edge 61 of the protective film resist layer 26.

In addition, in this embodiment, the following method and configuration can be employed.

In the above-described embodiment, the method, in which after the protective film resist layer 26 is formed on the ITO film layer 25, the electric conduction portion 29 is formed, is used, but there is no limitation thereto. In this embodiment, for example, a method, in which after a conductive material is applied onto the ITO film layer 25 to form the electric conduction portion 29, the protective film resist layer 26 is formed, may be employed. That is, the electric conduction portion forming process S2 may be performed before the protective film resist layer forming process S1. In this case, the electric conduction portion 29 is formed, and then the protective film resist layer 26 is formed at a part of a region in which the electric conduction portion 29 is not formed. A region in which the electric conduction portion 29 and the protective film resist layer 26 are not formed becomes the exposed portion.

Figure 12:
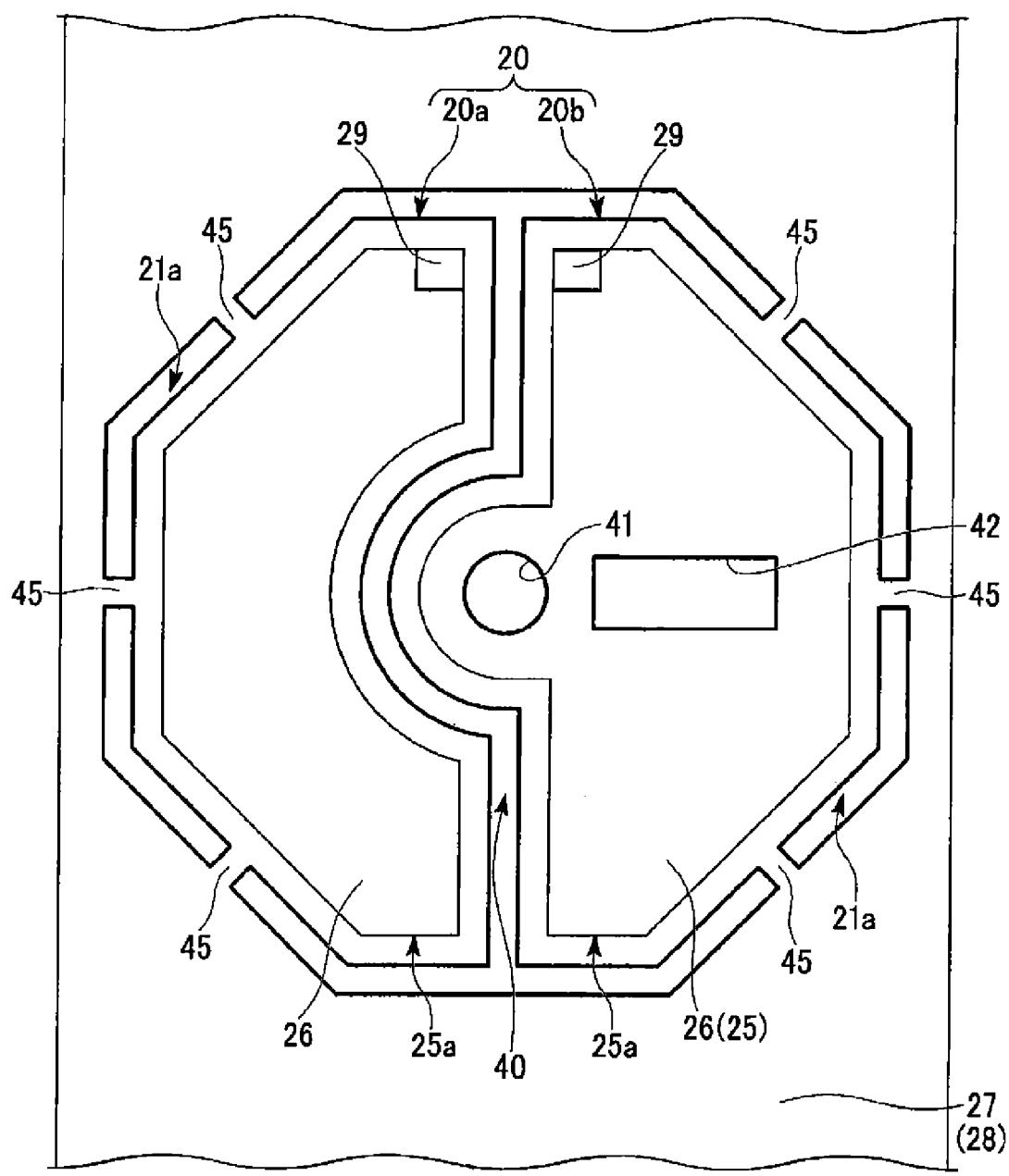
FIG. 12 is a plan view illustrating another example of the solar cell panel of this embodiment.

FIG. 12 illustrates an example in which the electric conduction portion 29 is formed at a position different from FIG. 6. In FIG. 12, the same reference numbers are given to the same constituent elements as FIG. 6. As shown in FIG. 12, when the electric conduction portion 29 is disposed on an outer side in comparison to the solar cell module, it is possible to appropriately cope with shortening of an interconnection that is connected to the electric conduction portion 29 and miniaturization of a circuit module and the like which are connected to the electric conduction portion 29. In addition, when the electric conduction portion 29 is disposed on a further outer side, a reduction in an interference portion with respect to a mechanical tool during assembly to a wristwatch is also possible. Accordingly, a degree of freedom for design of the mechanical tool can be raised, and it is also possible to make the thickness of the wristwatch small.

In addition, in the above-described embodiment, in the application process S1a of the protective film resist layer forming process S1, and the application process S2a of the electric conduction portion forming process S2, the screen printing method is used, but there is no limitation thereto. In this embodiment, for example, in the application process S1a and the application process S2a, application of a material may be performed by using a dispenser method, a lamination method, a spin coating method, a physical vapor deposition (PVD) method, a chemical vapor deposition (CVD) method, and the like.

In addition, patterning of the protective film resist layer 26 in a case of using the above-described application method is not particularly limited, and for example, photolithography may be used, and a patterning method by laser machining, and the like may be used.

In addition, in this embodiment, instead of the laser-cutting process S4, a process of processing the solar cell substrate 28 by a processing method by etching, a processing method by wire discharging, a press processing and mechanical processing method by a mold, and the like may be provided.

In addition, the above-described embodiment has a configuration in which the end edge of the protective film resist layer 26 and the end edge of the ITO film layer 25 are flush with each other in a plan view (when viewed in the XY plane), but there is no limitation thereto. For example, this embodiment may have a configuration similar to a solar cell module 110 shown in FIG. 8.

Figure 8:
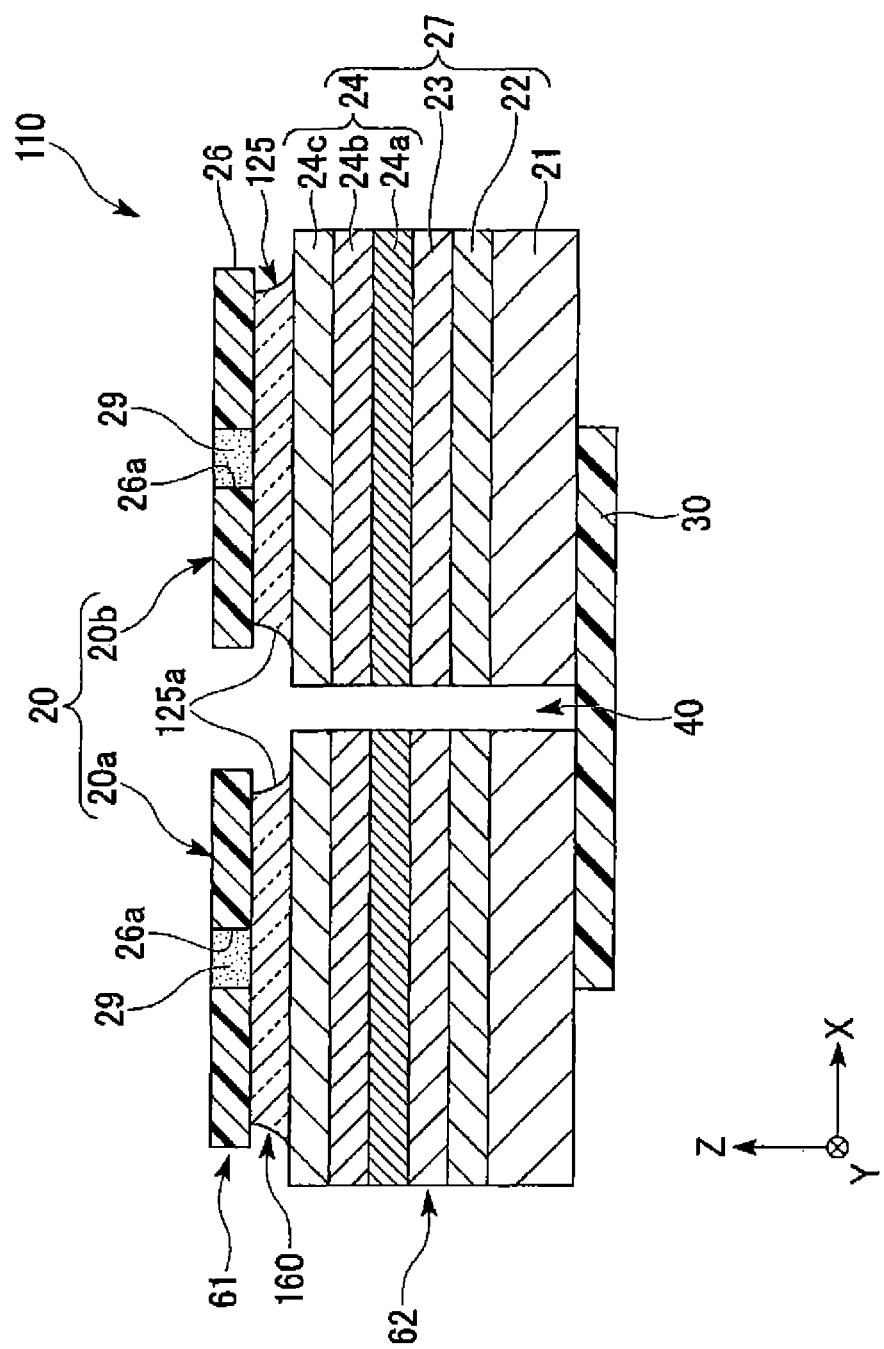
FIG. 8 is a cross-sectional view illustrating another example of the solar cell module of this embodiment.

As shown in FIG. 8, in the solar cell module 110, an end edge 160 of a surface on a protective film resist layer 26 side in an ITO film layer (transparent conductive film layer) 125 is positioned on an inner side in comparison to the end edge 61 of the protective film resist layer 26. That is, a concave portion 125a due to over-etching is formed in the end edge 160 of the ITO film layer 125.

As is the case with the solar cell module 110, a configuration in which the end edge of the ITO film layer 125 is positioned on an inner side of the end edge of the protective film resist layer 26 is specific to the method of manufacturing the solar cell module of this embodiment. In the method of manufacturing the solar cell module of this embodiment, in a case of selecting the wet etching as the etching method of the ITO film layer 125, a solar cell module that is manufactured tends to have this configuration.

In addition, the above-described embodiment has a configuration in which the ITO film layer 25 on an outer edge of the solar cell main body 27 is removed, but there is no limitation thereto. For example, this embodiment may have a configuration similar to a solar cell module 210 shown in FIG. 9.

Figure 9:
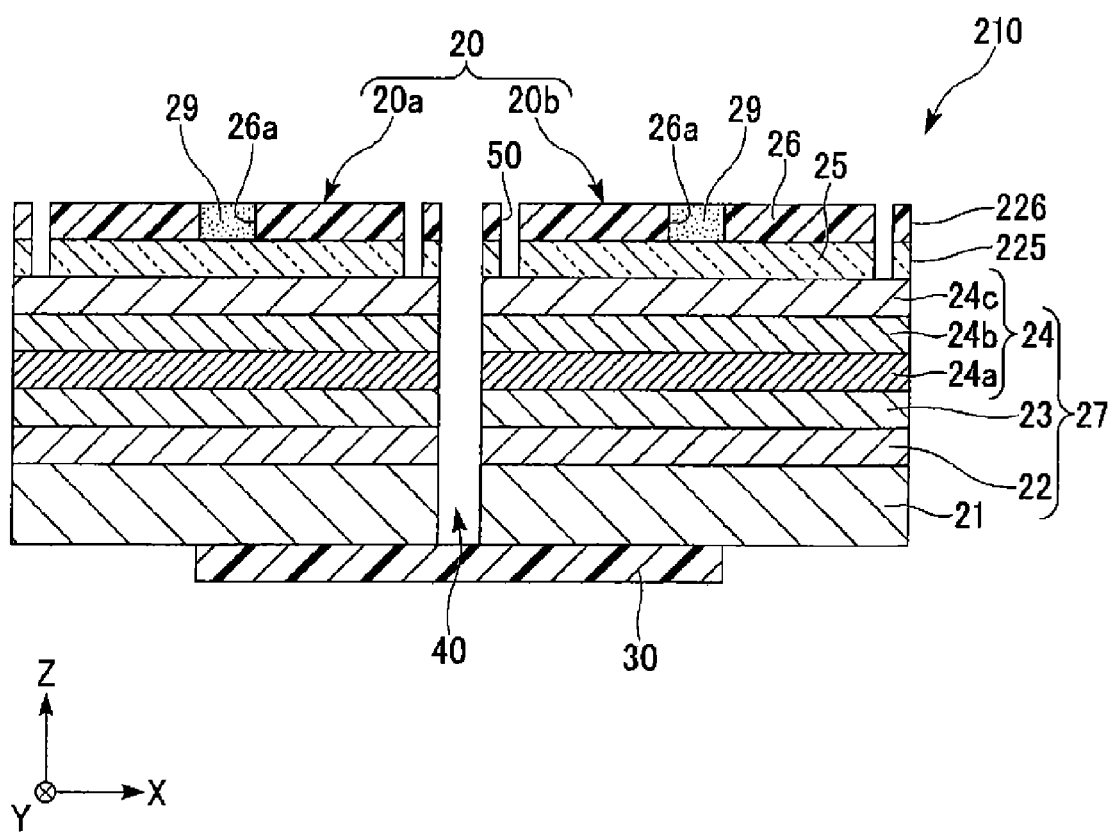
FIG. 9 is a cross-sectional view illustrating still another example of the solar cell module of this embodiment.

As shown in FIG. 9, in the solar cell module 210, a protective film resist layer (resist layer) 226 and an ITO film layer (conductive layer) 225 are formed in such a manner that a groove 50 is formed at the periphery of the protective film resist layer 26 and the ITO film layer 25. That is, the protective film resist layer 226 and the ITO film layer 225 are formed on the outer edge of the solar cell main body 27. With regard to this configuration, in a manufacturing process, formation of the protective film resist layer and etching of the ITO film layer are performed in such a manner that the groove 50 is formed.

In addition, the above-described embodiment has a configuration in which the solar cell module 10 includes the first individual piece 20*a* and the second individual piece 20*b* which are divided by the division line 40, but there is no limitation thereto. In this embodiment, an arbitrary solar cell module is possible in a range of a solar cell module provided with a protective film that protects an electrode.

Next, as an example in which the solar cell module 10 of this embodiment is mounted, a timepiece in which the solar cell module 10 is mounted will be described.

In this embodiment, as a timepiece in which the solar cell module 10 is mounted, a case where a wristwatch is used will be exemplified.

Figure 10:
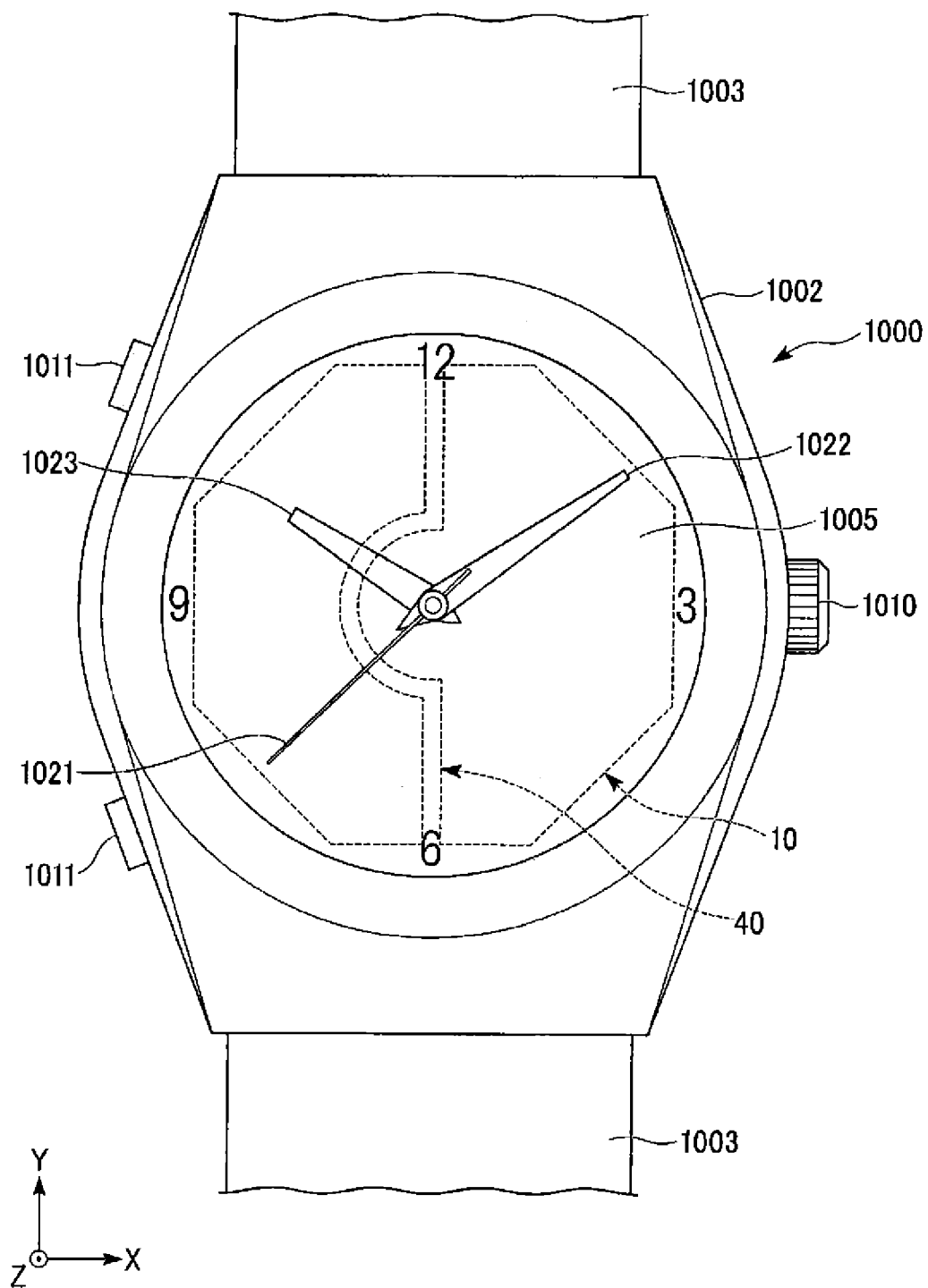
FIG. 10 is a plan view illustrating a timepiece in which the solar cell module of this embodiment is mounted.
Figure 11:
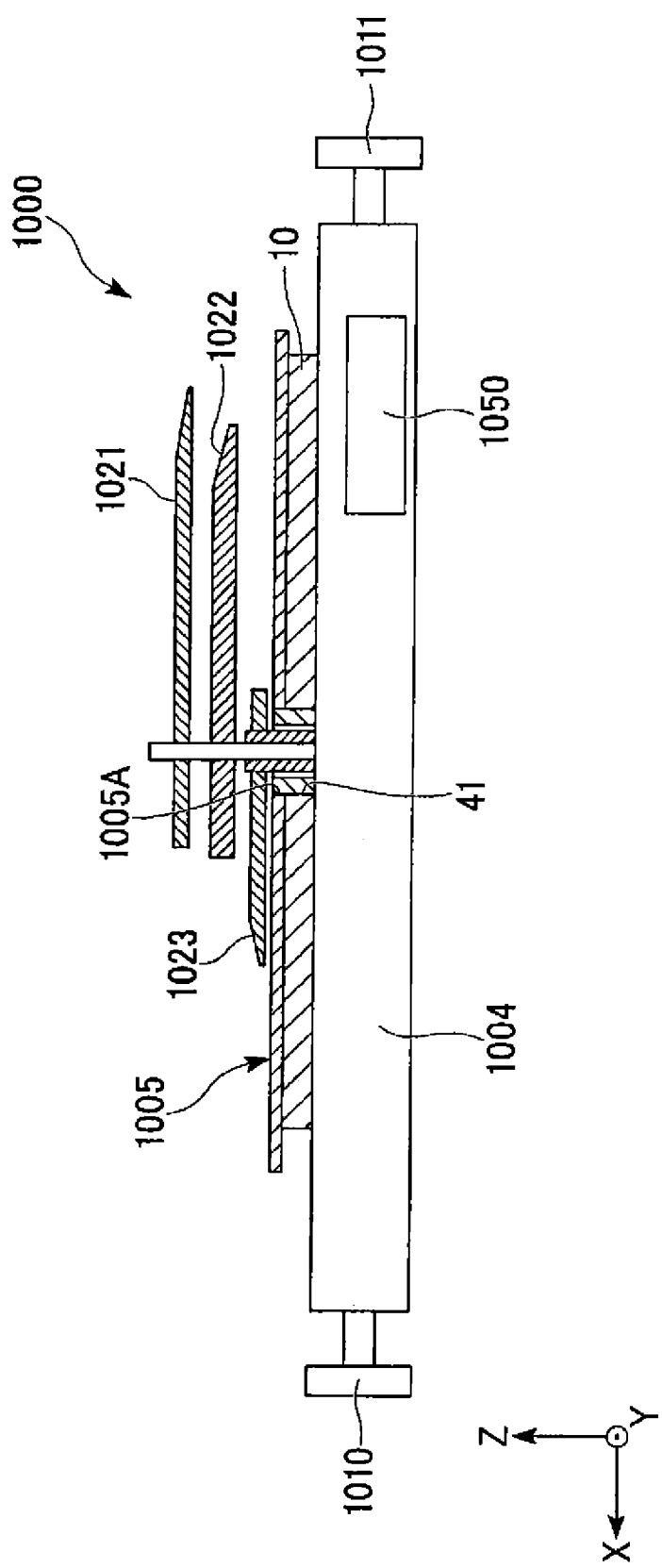
FIG. 11 is a cross-sectional view illustrating the timepiece in which the solar cell module of this embodiment is mounted.

FIGS. 10 and 11 are views illustrating a wristwatch 1000 of this embodiment in which the solar cell module 10 is mounted. FIG. 10 is a plan view and FIG. 11 is a cross-sectional view. In FIG. 11, description is appropriately omitted.

As shown in FIG. 10, the wristwatch 1000 includes a timepiece case 1002, and a pair of bands 1003 that are connected to the timepiece case 1002. The timepiece case 1002 is formed from a metallic material such as stainless steel or a resin material such as a plastic resin, and as shown in FIG. 11, a movement 1004, a timepiece dial plate (dial plate) 1005, and a solar cell module 10 are accommodated inside the timepiece case 1002.

A transparent cover (not shown) formed from glass or a resin is press-fit and fixed to a timepiece dial plate 1005 side (a timepiece front side, +Z side) inside the timepiece case 1002 through a press-fit ring (not shown) formed from a resin or a metal. In addition, a rear cover (not shown) is screwed with a movement 1004 side (a timepiece rear side, −Z side) inside the timepiece case 1002 through a packing (not shown), and a sealing property of the inside of the timepiece case 1002 is secured by the rear cover and the transparent cover.

In addition, as shown in FIG. 10, the timepiece case 1002 is provided with a winding knob 1010 and two manipulation buttons 1011 as operation elements. The winding knob 1010 is provided in such a manner that pushing and pulling is possible in multiple steps (in this embodiment, two steps) and rotation is possible.

As shown in FIG. 11, the movement 1004 includes a second hand 1021, a minute hand 1022, an hour hand 1023, and a power supply device 1050. The second hand 1021, the minute hand 1022, and the hour hand 1023 are concentrically arranged. That is, respective axes on which the second hand 1021, the minute hand 1022, and the hour hand 1023 are provided are provided in a concentric manner. The axes around which the second hand 1021, the minute hand 1022, and the hour hand 1023 are provided protrude from the timepiece dial plate 1005 toward an upper side (+Z side) through the through-hole 41 formed in the solar cell module 10 and a through-hole 1005A formed in the timepiece dial plate 1005.

The power supply device 1050 supplies electric power to the movement 1004. The power supply device 1050 includes a secondary cell (not shown) that is charged by the solar cell module 10.

The timepiece dial plate 1005 is a flat plate on which characters indicating hours are displayed. In FIG. 10, a time display of only 12 o'clock, 3 o'clock, 6 o'clock, and 9 o'clock is shown.

The timepiece dial plate 1005 has a light-transmitting property. An optical transmittance of the timepiece dial plate 1005 is, for example, 20%.

The solar cell module 10 is provided between the timepiece dial plate 1005 and the movement 1004. As shown in FIG. 10, the solar cell module 10 is provided in such a manner that a line connecting ends of the division line 40 is provided on the same line connecting 12 o'clock and 6 o'clock of the timepiece dial plate 1005.

In the solar cell module 10, the first individual piece 20*a* and the second individual piece 20*b* of the solar cell panel 20 are connected in series, and the solar cell module 10 is mounted in the wristwatch 1000. More specifically, the ITO film layer 25 (positive electrode) of the first individual piece 20*a* and the SUS substrate (negative electrode) of the second individual piece 20*b* are electrically connected to each other. A connection site (connection terminal) in the ITO film layer 25 is a portion at which the ITO film layer 25 is exposed by the above-described through-hole portion 26*a*.

The SUS substrate 21 of the first individual piece 20*a* and the ITO film layer 25 of the second individual piece 20*b* are electrically connected to the power supply device 1050 (external circuit) including a secondary cell. That is, the solar cell module 10 is electrically connected to the power supply device 1050 including the secondary cell.

When solar light beams are incident to the wristwatch 1000 from a timepiece dial plate 1005 side (−Z side), the solar light beams are incident to the solar cell module 10 through the timepiece dial plate 1005 having a light-transmitting property. According to this, the solar cell module 10 generates electric power, and the secondary cell of the power supply device 1050 that is electrically connected to the solar cell module 10 is charged.

In addition, in the above-described embodiment, the timepiece has been described as an example of an apparatus in which the solar cell module is mounted, but there is no limitation thereto. For example, an apparatus, in which the solar cell module according to the invention is mounted, may be a portable terminal.

EXAMPLES

In this example, verification was made about whether or not the ITO film layer could be etched by using a conductive material as a mask. As a conductive material, a silver-containing conductive material (DW-440L-29C, manufactured by Toyobo Co., Ltd.), and a carbon-containing conductive material (C2050503D1, manufactured by Rasa Industries, LTD.) were selected. Each of the conductive materials was applied onto a surface of the ITO film layer, and etching of the ITO film layer was performed. As an etching method, dry etching using HBr was selected.

As a result, even in a case of applying any conductive material, the ITO film layer in a portion in which the conductive material was not applied could be selectively removed. In addition, it was confirmed that the conductive material was not removed by the etching, and there was no problem with regard to electrical connection with the ITO film layer.

As described above, according to the above-described embodiment, it was confirmed that the electric conduction portion could be used as an etching mask, and thus the manufacturing process of the solar cell module could be simplified.

What is claimed is:

1. A solar cell module, comprising:
   an electric power generating layer that receives light beams and generates electric power;
   a conductive layer that is formed on the electric power generating layer;
   a resist layer that is formed on the conductive layer; and
   an electric conduction portion that is provided in a resist layer non-forming portion and is electrically connected to the conductive layer,
   wherein an end edge of a surface of the conductive layer on a resist layer side is flush with an end edge of the resist layer, or is positioned on an inner side in comparison to an end edge of the resist layer in a plan view, and
   the end edge of the surface of the conductive layer on the resist layer side and the end edge of the resist layer are on an inner side in comparison to an end edge of the electric power generating layer in the plan view.

* * * * *